(12) United States Patent
Rizzolo et al.

(10) Patent No.: US 6,751,765 B1
(45) Date of Patent: Jun. 15, 2004

(54) METHOD AND SYSTEM FOR DETERMINING REPEATABLE YIELD DETRACTORS OF INTEGRATED CIRCUITS

(75) Inventors: Richard F. Rizzolo, Red Hook, NY (US); Rocco E. DeStefano, Rhinebeck, NY (US); Joseph E. Eckelman, Hopewell Junction, NY (US); Thomas G. Foote, Milan, NY (US); Steven Michnowski, Wappingers Falls, NY (US); Franco Motika, Hopewell Junction, NY (US); Phillip J. Nigh, Williston, VT (US); Bryan J. Robbins, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 460 days.

(21) Appl. No.: 09/722,880

(22) Filed: Nov. 27, 2000

(51) Int. Cl.$^7$ .............................................. G01R 31/28
(52) U.S. Cl. ...................................... 714/732; 714/738
(58) Field of Search .......................... 714/726, 30, 731, 714/719, 738, 733, 723, 735, 732, 718, 765, 728; 324/73.1

(56) References Cited

U.S. PATENT DOCUMENTS

| | | | | |
|---|---|---|---|---|
| 3,751,647 A | * | 8/1973 | Maeder et al. ............... | 713/401 |
| 5,202,978 A | * | 4/1993 | Nozuyama .................... | 714/30 |
| 5,278,842 A | * | 1/1994 | Berry et al. ................. | 714/726 |
| 5,457,697 A | * | 10/1995 | Malleo-Roach et al. ..... | 714/726 |
| 5,925,144 A | | 7/1999 | Sebaa .......................... | 714/733 |
| 5,930,270 A | | 7/1999 | Forlenza et al. ............ | 317/25.1 |
| 5,938,784 A | | 8/1999 | Kim ............................ | 714/733 |
| 5,983,009 A | | 11/1999 | Lepejian et al. ........ | 395/500.19 |
| 5,983,380 A | * | 11/1999 | Motika et al. ............... | 714/733 |
| 5,983,381 A | * | 11/1999 | Chakradhar et al. ........ | 714/738 |
| 6,012,157 A | | 1/2000 | Lu ............................... | 714/741 |
| 6,021,514 A | * | 2/2000 | Koprowski ................... | 714/733 |
| 6,314,540 B1 | * | 11/2001 | Huott et al. ................. | 714/738 |
| 6,453,436 B1 | * | 9/2002 | Rizzolo et al. .............. | 714/726 |

* cited by examiner

*Primary Examiner*—Albert Decady
*Assistant Examiner*—Mujtaba Chaudry
(74) *Attorney, Agent, or Firm*—Lynn Augspurger; Cantor Colburn LLP

(57) ABSTRACT

An exemplary embodiment of the invention is a method for LBIST testing integrated circuit. The method includes generating a plurality of multi-bit test patterns and grouping the multi-bit test patterns by a plurality of test pattern partitions including a first test pattern partition having a first number of bits and a second test pattern partition having second number of bits greater than the first number. The first test pattern partition is applied to the integrated circuit to generate a first signature that is compared to a first reference signature to detect a failure. The second test pattern partition is applied to the integrated circuit to generate a second signature that is compared to a second reference signature to detect a failure in the integrated circuit.

10 Claims, 3 Drawing Sheets

METHOD AND SYSTEM FOR DETERMINING REPEATABLE YIELD DETRACTORS OF INTEGRATED CIRCUITS

BACKGROUND OF THE INVENTION

This invention relates to the testing of logic systems in semiconductor integrated circuits or chips. More specifically, the invention relates to a method and apparatus for more easily identifying common causes of logic circuit yield detractors.

Yield is the ratio of all good chips to the total number of chips produced. It is an extremely important quantity and often determines if a program is highly profitable or a loss. A major effort in the development of a new semiconductor technology is termed "yield learning." Yield learning covers all activities to raise yield to volume manufacturable levels. Yield detractors include process random defects, process systematic problems, mask defects or problems, and circuit marginality problems. Many of these problems have random characteristics, that is, they occur in different areas of the chip and on different circuits without any apparent pattern. This is the usual characteristic when a process is mature. As long as the defect level is sufficiently low it is acceptable. High random defect levels are a serious concern and usually indicate a more systematic problem such as contamination.

Regular structures such as memory arrays and test structures built on the kerf (the space on the wafer between chips) serve as monitors for high random defect levels. There are other systematic, or repeatable, yield detractors that are more difficult to diagnose. These are problems that occur in the logic area of the chip. They may be caused by circuit marginality, mask defects, or process marginality for structures unique to logic. If these problems cause very low yield, there is a great effort undertaken to determine the cause and fix the problem. If the yield loss is low, however, or only occurs on certain lots, it may be interpreted as expected random defects. "Low" yield loss is relative to the size of the chip, the complexity of the process, and the maturity of the process. If "expected" yield is 20% and the actual yield is 16%, the difference may be attributed to random defects, when in fact it may be due to systematic defects with a common cause that may be much more easily fixed.

Chips are tested by applying a sequential set of electrical voltage levels to chip inputs and storage elements that represent logical '1' and '0'. After the appropriate clocking signals to activate the storage elements, those storage elements and the chip outputs are sampled and compared to the expected logical value. Access to the storage elements may be done using LSSD.

As the complexity of chips increase, there is increasing demand on the test system to store the necessary '1' and '0' confirmations to apply as stimulus on the inputs and expected values are the outputs to compare against. The term 'input' in this context means whatever elements the local stimulus is applied to, either physical chip inputs or storage elements accessible by some method such as LSSD.

There are two methods of reducing the storage requirements of these so-called "test patterns". One method is to compress all the measurements sequentially into a set of storage elements known as Multiple Input Shift Register or MISR. The MISR value is measured at the end of the test, which may be thousands of clock cycles or more, and compared with its expected value. Another method, known as Logic Built In Self Test or LBIST uses a structure known as a Pseudo Random Pattern Generator or PRPG, generates the stimulus in a pseudo random fashion. After the functional clock cycle, the results are compressed in a MISR.

In the existing state of the art, repeatable defects could be inferred if the same test patterns failed on multiple chips and especially if the same elements failed on those patterns. In a test that comprises, for example, 1,000 patterns, if test #512 fails on a number of parts, then repeatable defects are highly suspect.

The existing state of the art has practical limitations. In practice, much of the chip is tested in the first few patterns so it is natural that earlier patterns will have a higher failure rate and the vast majority of these will not be common fails. If the individual outputs are counted, there is more resolution of the failure. For example, if multiple chips failed in a way that on pattern 5, output 572 as a '1', then this would more definitively point to a repeatable defect as the cause of the failure.

There are still limits to the usefulness of this method, however, because there are on large chips tens or hundreds of thousands of outputs (chip outputs and latches) that are measured. It is impractical to compare all the possible failure modes for thousands of latches on thousands of patterns across thousands of chips.

Yet one more limitation of the existing method is that it is not applicable to any test that compresses measurements into a register after every cycle. This is critical, because such test methodologies, such as LBIST are increasingly used to test advanced chips.

SUMMARY OF THE INVENTION

An exemplary embodiment of the invention is a method for LBIST testing an integrated circuit. The method includes generating a plurality of multi-bit test patterns and grouping the multi-bit test patterns by a plurality of test pattern partitions including a first test pattern partition having a first number of bits and a second test pattern partition having second number of bits greater than the first number. The first test pattern partition is applied to the integrated circuit to generate a first signature that is compared to a first reference signature to detect a failure. The second test pattern partition is applied to the integrated circuit logic to generate a second signature that is compared to a second reference signature to detect a failure in the integrated circuit.

DETAILED DESCRIPTION OF THE INVENTION

Figure 1:
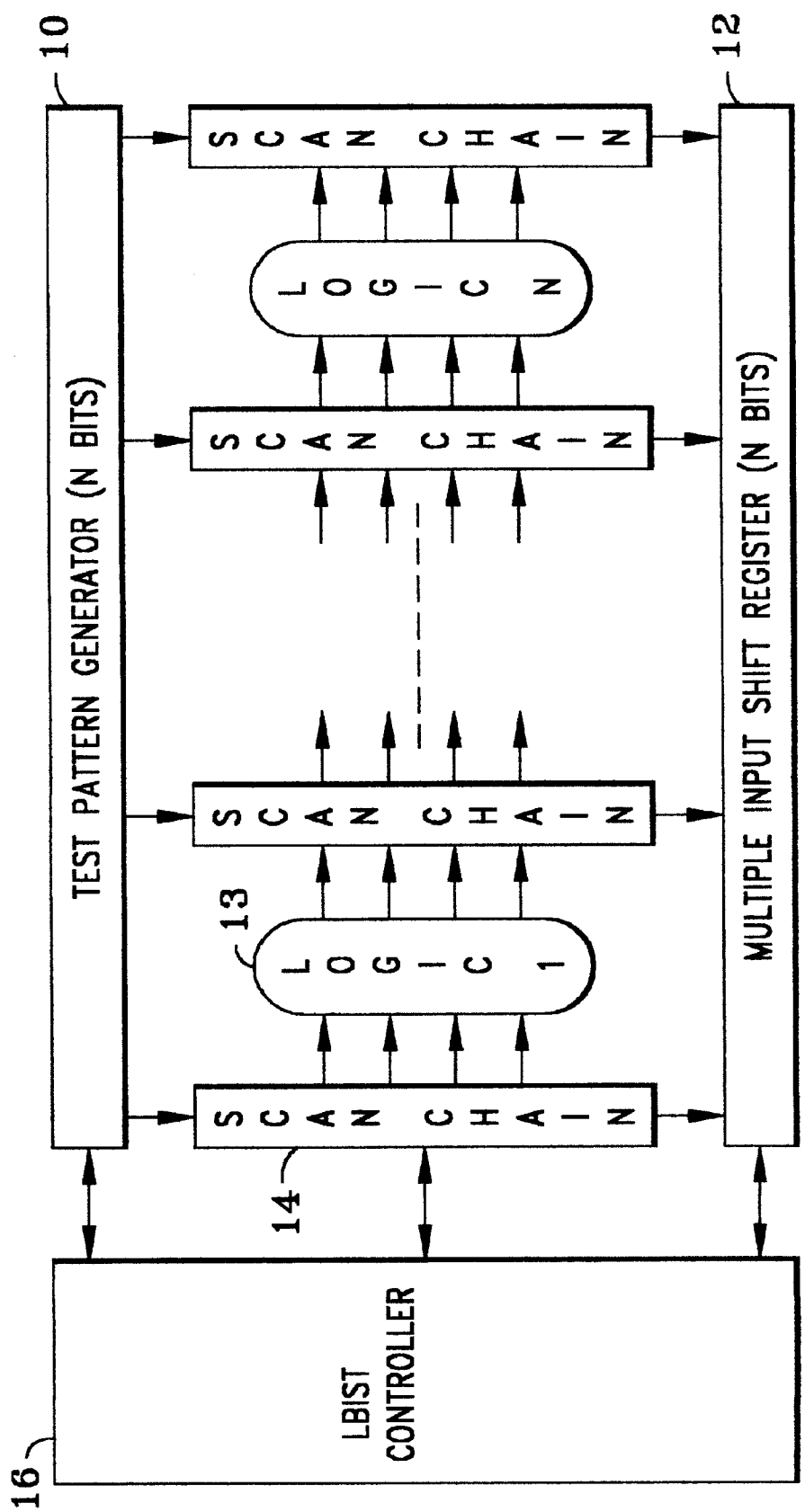
FIG. 1 is a block diagram of a LBIST system in an exemplary embodiment of the invention.

FIG. 1 shows a high-level overview of the chip LBIST implementation for LBIST testing chip logic with the use of a test pattern generator 10 which is used to generate the test patterns passing through a scan chain 14 to a multiple input signature register (MISR) 12 to compress the test. An LBIST controller 16 is used to apply the clocks and controls to the test pattern generator, MISR and system logic to perform the test. The test pattern generator 10 of FIG. 1 generates test data which passes through logic via multiple parallel scan chains 14 which are connected between the test pattern generator and MISR 12. The test pattern generator 10 having N bits generates the test data which is scanned into the scan chains 14 as the test pattern for the scan operation portion of the LBIST test of the chip. Clock signals are applied to the logic 13 and the result of the test pattern and logic 13 is scanned out of the scan chains 14 and compressed and stored into the MISR 12 to generate a test signature. The chip is partitioned into N sections of logic 13 which are fed by N scan chains 14. An LBIST controller 16 (e.g., a microprocessor executing control program) controls the LBIST$T by applying the appropriate clocks, comparing the test signature in the MISR 12 to reference signatures to detect a failure and detecting common failing signatures as described herein.

A complex chip may have several MISRs, each containing dozens of bits. After every clock cycle, the new- measurements are compressed into each MISR. At the end of the test, several hundred thousand or more test cycles, each containing ten thousand or more measures, are compressed into an exemplary signature of 4×61 bits. If that signature matches the expected signature generated, for example, by a simulation, then the chip is good. If at least one measure is wrong for any one pattern, the signature will not match and the chip will be labeled as a "fail".

Measures map nearly uniquely into a given signature. If two chips have "bad" signatures that match, it means that both chips failed exactly the same outputs in the same way on exactly the same patterns. Because of this, matching failing signatures are a reliable indicator of a common systematic failure mechanism.

Figure 4A:
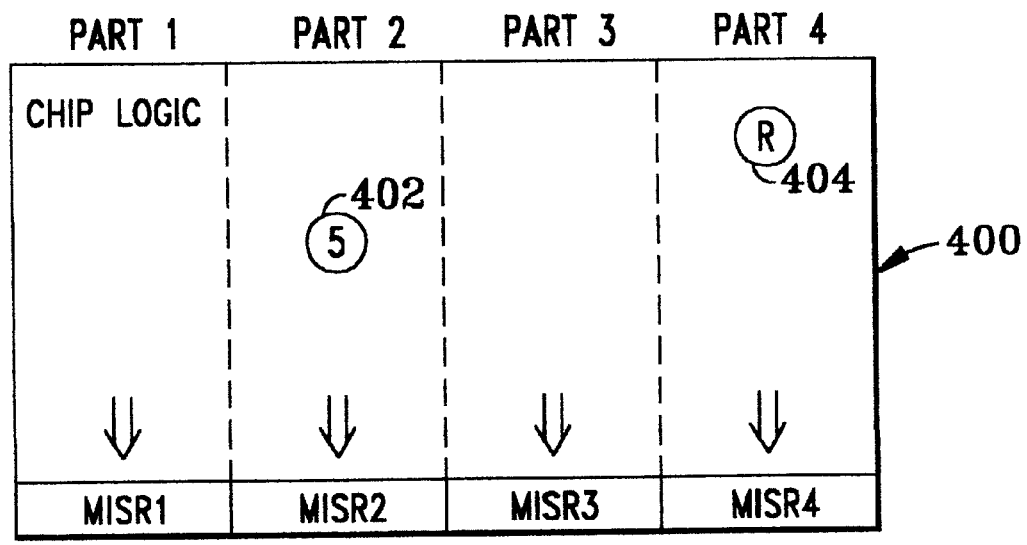
FIGS. 4A and 4B depict exemplary partitioned multiple partitioned shift registers.
Figure 4B:
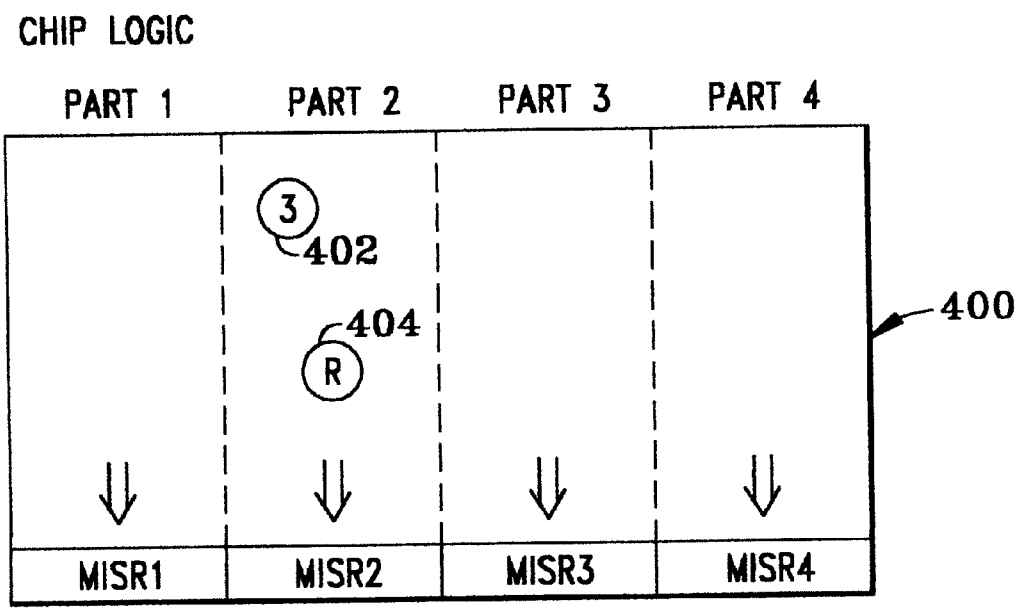

For large chips in an advanced semi-conductor process in development, it is not unusual for the random defect level to be very high. Yields may be 5% or even less than 1%. A partitioning method is used to enhance the detection of systematic defects. Assume that a common mode or systematic logic defect is present on 10% of all chips, assume also that random logic defects occur on 98% of all chips. In that case, a total of 1,000 chips would need testing to get 20 good chips of which 2 may show the common mode failing signature. Assume that the systematic fail is first detected after n patterns. The number n is quite often small, often less than 100 because most of the chip is tested by early patterns. Furthermore, assume that there are multiple MISRs (MISR1, MISR2, MISR3 and MISR4) and the systematic fail only affects MISR2. FIGS. 4A and 4B depict an exemplary chip 400 partitioned into four sections. A systematic defect 402 and a random defect 404 are depicted. In this case, the systematic defect 402 in pattern n in MISR 2 can be resolved from the random defect 404:

(1) if the random defect 404 affects only MISRs 1, 3, 4, not 2 (as shown in FIG. 4A), or (2) if the random defect 404 is first tested in MISR 2 on pattern n+1 or greater (as shown in FIG. 4B) i.e., the random defect 404 if first tested later than the systematic defect 402.

To enhance detection of systematic defects in the presence of noise, MISRs from multiple chips are compared, not only for the final pattern count but for smaller pattern counts as well. Like MISRs compared on the same pattern count for multiple patterns. If any match, these chips are highlighted as common mode fails. In the example given, it is likely that 75% of the defects will occur on logic feeding a different MISR, and 50% of the defects will occur on patterns after the systematic fail. In that case, 87.5% (75%+50%×25%) of the systematic defects would be distinguishable from random defects. In that case, only about 30 chips need to be tested to identify a systematic defect (10%×30×87.5%) showing up on two different chips.

Pattern partitioning aids in detecting systematic defects that have marginal or intermittent behavior. Small changes in voltage, temperature, resistance, etc. may change a "fail" to a pass. The same defect may affect 10 bits of a 32 bit bus on one chip, 12 bits on a second chip, and 13 bits on a third chip. Pattern partitioning also helps identify marginal systematic fails. An exemplary method of partitioning the LBIST pattern set uses test coverage information based on fault simulation.

Figure 2:
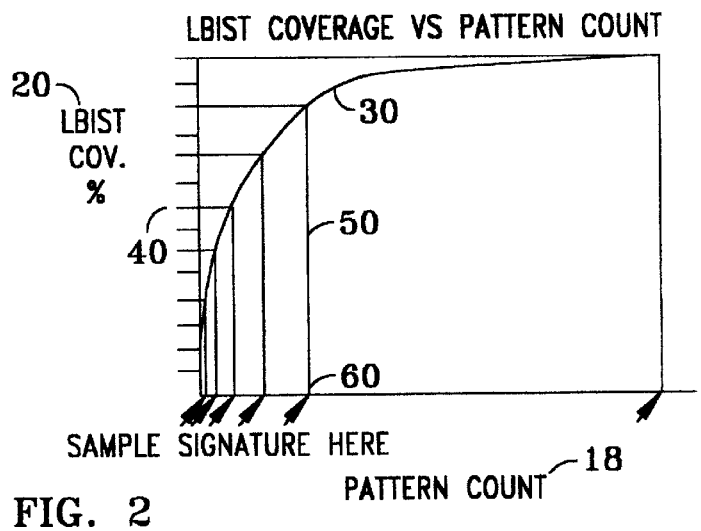
FIG. 2 illustrates a way to partition the tests.

FIG. 2 is a graph of LBIST coverage percentage 20 versus the pattern count 18 for an exemplary integrated circuit. The curve 30 may be obtained from the pattern simulation. As seen in FIG. 2, on the vertical axis equal intervals 40 of LBIST coverage are indicated. Where these intervals intersect the curve 30 is where the test should be partitioned 50. Notice there are more partitions 50 at lower pattern counts 18 because the coverage 20 increases so quickly. The number of partitions 50 is most likely limited by practical considerations such as complexity of test program and test time.

Many parts have coverage curves that resemble FIG. 2. An alternative way of specifying pattern boundaries or defining the intersect curve 30 is at every $2^n$ patterns from n=0 to the end of the test. Since LBIST tests lengths are usually a multiple of 2, the last boundary is at the end of the test. For example, a 4K pattern test would be divided into 13 partitions.

Figure 3:
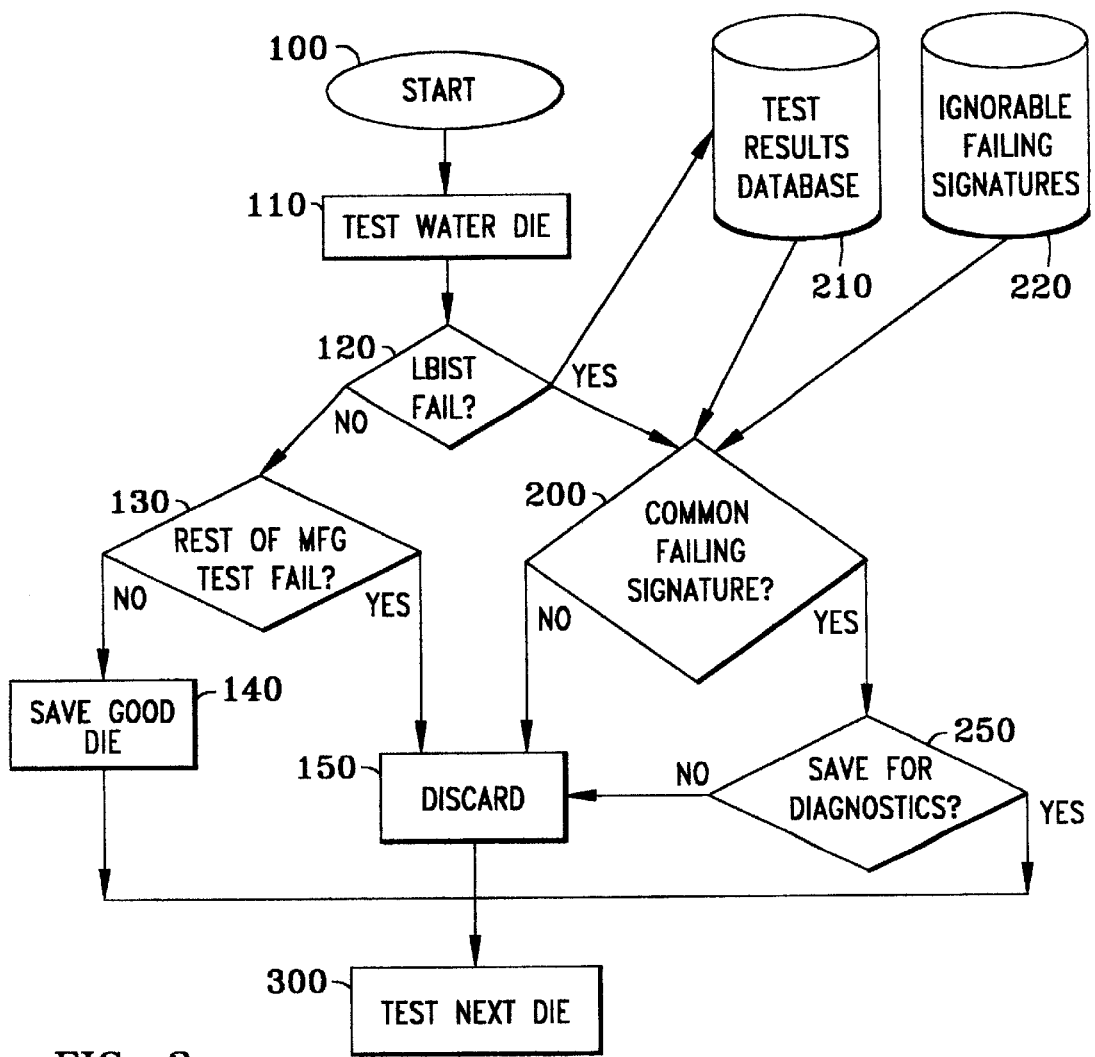
FIG. 3 shows a flowchart of the process of finding common failing signatures.

FIG. 3 is a flowchart of an exemplary process for testing integrated circuits. To begin the process, an LBIST test of a chip 110 is initiated at 100, The test patterns can be divided into a number of partitions 50, and the signature is checked at the end of each partition 50. The tests are ordered such that the smallest partitions are tested first. At step 120, it is determined whether the device under test has failed. This is determined by applying the test pattern partitions in order and comparing the signature to a reference signature. For example, a first test pattern partition is applied to the chip under test and a first signature is compared to a first reference signature. Then, a second test pattern partition is applied to the device under test and a second signature is compared to a second reference signature. When a signature has a mismatch occur for a test, that failing signature is saved in a record of a test database 210 containing reference failing signatures. The failing record is indexed by a unique identifier for the clip, such as an electronic chip ID. Practical considerations, such as the size of the database may limit the number of bits of the signature that are saved. A limited signature is acceptable as long as the probability of aliasing is small. Most likely, ten or fewer bits may be saved of the MISR. Saving mismatches from the expected MISR is also acceptable, because common mode failures can be just as easily extracted from that data. Finally, only the first failing signature within each partition 50 (or equivalent) may be saved.

The more conditions under which this partitioned test is run, the more potential for determining marginal or ignorable common fails stored in database 220. Such conditions include high and low specified voltage corners, running the test at DC or at speed, etc. Additionally, other conditions can be considered such as high and low temperature. An identifier in the database record 210 to identify the failing test condition is useful but not necessary.

If failing signatures are found at step 120, flow proceeds to step 200 where the process determines the existence of common failing signatures which indicate a non-random source of failure such as process defects. Failing signatures for the chip under test 110 are compared by a LBIST controller 16 against all reference failing signatures in database 210. Only signatures of identical tests may be compared. For example, if an LBIST test of 32 patterns (LBIST_32) fails, it is to be compared against the identical 32 pattern long LBIST test signature for other chips. The signature may be compared across environmental conditions but caution must be exercised or a common fail may not be found. For example, if a chip fails LBIST_32 at low voltage and it is only compared with other chips failing LBIST_32 at low voltage, then a common failing signature may not be found. It may be that there is a chip that failed with the same signature at nominal voltage and another characteristic (intrinsic chip speed for example) made it pass at low voltage. Queries should be broad, across all environmental conditions for the same test.

Chips that do not fail the LBIST tests will generally also be tested at step 130 for other manufacturing defects. If they fail these subsequent tests 130 they are generally discarded at step 150. Prior to being discarded, a description of the manufacturing defect may be maintained for overall evaluation of the manufacturing process. After discarding a chip, the testing can begin again on another chip at 300 if one is available. Chips that pass the manufacturing tests can be saved as shown at 140.

At step 200, if there are no common failing signatures, flow proceeds to step 150 and the device under test is discarded as being a failing chip. If a failing signature of one chip matches a failing signature of another chip that indicates that some non-random failure mechanism is taking place. Flow proceeds to step 250 where the device under test can be saved for diagnostics or discarded. Even if the incidence is low, there is a concern because whatever caused the problem may become much worse when the next semiconductor lot is tested or if the test specifications change slightly. One of the problems of highest concern is circuit marginality. Circuit behavior may be marginal at voltage, temperature, or cycle time limits. This behavior must be identified quickly so that fixes can get into the next release of the chip. Yield may be acceptable for one lot, but unacceptably low for the next lot.

Some signatures may be common but indicate either a catastrophic problem or normal behavior. These signatures are stored in a database 220 of ignorable failing signatures and should be treated separately and not usually considered part of the common mode fail search. An example of a catastrophic problem would be poor electrical contact to a chip lead required for LBIST. Another would be the LBIST state machine never starts and the signature is trivial. Normal behavior may be a defect free response caused by a circuit that failed in an expected manner. An example of this would be caused by running LBIST at shorter and shorter cycle times exceeding the chip specification until a fail occurs. This "fail" may be caused by predicted timing critical paths on the chip. Since chips of a given type are all designed the same, it is to be expected that many chips will have the same critical path failing, resulting in the same failing signature. As a minimum, common failing signatures need to be identified so the yield loss due to them can be quantified. It is recommended that chips with common fails be saved for further diagnostic work to determine the root cause and identify fixes. With this invention, chips that have common logic problems can be easily identified. The relative yield loss attributable to each common problem can be calculated and the chips set aside for further diagnostic analysis to determine root cause and fix.

The present invention can include embodiments in the form of computer-implemented processes and apparatuses for practicing those processes. That is, a processor (such as the LBIST controller) can execute a program stored in a storage medium to perform the process of FIG. 3. The present invention can also include embodiments in the form of computer program code containing instructions embodied in tangible media, such as floppy diskettes, D-ROMs, hard drives, or any other computer-readable storage medium, wherein, when the computer program code is loaded into and executed by a computer, the computer becomes an apparatus for practicing the invention. The present invention can also include embodiments in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the preferred embodiment to the invention has been described, it will be understood that those skilled in the art, both now and in the future, may make various improvements and enhancements which fall within the scope of the claims which follow.

These claims should be construed to maintain the proper protection for the invention first described.

What is claimed is:

1. A method for LBIST testing an integrated circuit comprising:

generating a plurality of multi-bit test patterns;

dividing each of said multi-bit test patterns by a plurality of test pattern partitions such that each of said multi-bit test patterns includes a first test pattern partition having a first number of bits and a second test pattern partition having second number of bits greater than said first number;

applying said first number of bits to said integrated circuit and generating a first signature;

comparing said first signature to a first reference signature to detect a failure in said integrated circuit;

applying said second number of bits to said integrated circuit and generating a second signature;

comparing said second signature to a second reference signature to detect a failure in said integrated circuit;

generating a unique identifier upon the detection of a failure in said integrated circuit;

storing said unique identifier along with a corresponding failure signature; and comparing said failure signature to a reference failure signature to detect failures having a common source.

2. A method for LBIST testing an integrated circuit according to claim 1 wherein said plurality of test pattern partitions are determined by designating every $2^n$ pattern numbers from said plurality of multi-bit test patterns as the beginning of each partition, wherein n starts at zero and increases by a constant.

3. A method for LBIST testing an integrated circuit according to claim 1, further comprising grouping the smallest number of patterns in the first of said plurality of test pattern partitions.

4. A system for testing an integrated circuit comprising:

a test pattern generator for generating a plurality of test patterns wherein said test patterns are grouped into a plurality of partition such that no one of said plurality of partitions has the same number of patterns as another of said plurality of partitions;

a signature register for generating a partition signature for each of said plurality of partitions, wherein said partition signature of any one of said plurality of partitions is based solely on the results from the application of at least one test pattern associated with said one of said plurality of partitions; and an LBIST controller for comparing said partition signature of any one of said plurality of partitions to a reference signature to detect a failure in the logic of said integrated circuit;

wherein said LBIST controller:

generates a unique identifier upon the detection of a failure from said test pattern;

stores said unique identifier along with a corresponding failure signature; and compares said failure signature to a reference failure signature to detect failures having a common source.

5. The system for testing an integrated circuit of claim 4, wherein said test patterns are grouped such that after the first of said plurality of partitions each consecutively numbered partition includes a greater number of test patterns than the previous partition.

6. The system for testing an integrated circuit of claim 4, wherein said plurality of partitions are ordered based on equal intervals measuring the amount of logic tested on said integrated circuit at the completion of each of said grouped test patterns.

7. The system for testing an integrated circuit of claim 4, wherein said plurality of partitions are ordered based on a non-linear progression of the number of test patterns included in each of said grouped test patterns.

8. A storage medium encoded with machine-readable computer program code for testing an integrated circuit, the storage medium including instructions for causing a processor to implement a method comprising:

generating a plurality of multi-bit test patterns; dividing each of said multi-bit test patterns by a plurality of test pattern partitions such that each of said multi-bit test patterns includes a first test pattern partition having a first number of bits and a second test pattern partition having second number of bits greater than said first number;

applying said first number of bits to said integrated circuit and generating a first signature; comparing said first signature to a first reference signature to detect a failure in said integrated circuit;

applying said second number of bits to said integrated circuit and generating a second signature; and comparing said second signature to a second reference signature to detect a failure in said integrated circuit;

generating a unique identifier from said multi-bit test pattern upon the detection of a failure in said integrated circuit;

storing said unique identifier along with a corresponding failure signature; and comparing said failure signature to a reference failure signature to detect failures having a common source.

9. A storage medium for LBIST testing an integrated circuit according to claim 8 wherein said plurality of test patterns partitions are determined by designating every $2^n$ pattern numbers from said plurality of multi-bit test patterns as the beginning of each partition, wherein n starts at zero and increases by a constant.

10. A storage medium LBIST testing an integrated circuit according to claim 8, further comprising computer program code for causing the processor to implement:

grouping the smallest number of patterns in the first of said plurality of test pattern partitions.

* * * * *